United States Patent [19]

White et al.

[11] Patent Number: 5,522,733

[45] Date of Patent: Jun. 4, 1996

[54] ELECTRICAL CONNECTORS

[75] Inventors: Rowland S. White, Lunenburg, Mass.; Keith H. Jones, Locks Heath; David E. Ivey, Whitchurch, both of United Kingdom

[73] Assignee: MOD-TAP W Corp., Harvard, Mass.

[21] Appl. No.: 162,190

[22] PCT Filed: Jun. 3, 1992

[86] PCT No.: PCT/GB92/00998

§ 371 Date: Jun. 3, 1994

§ 102(e) Date: Jun. 3, 1994

[87] PCT Pub. No.: WO92/22941

PCT Pub. Date: Dec. 23, 1992

[30] Foreign Application Priority Data

Jun. 12, 1991 [GB] United Kingdom .................. 9112604
Jul. 5, 1991 [GB] United Kingdom .................. 9115020

[51] Int. Cl.$^6$ .................................................. H01R 4/24
[52] U.S. Cl. .......................................... 439/395; 439/404
[58] Field of Search .................................. 439/395–404, 439/417–419, 707–725

[56] References Cited

U.S. PATENT DOCUMENTS

| | | |
|---|---|---|
| 3,380,013 | 4/1968 | Krone et al. . |
| 3,611,264 | 10/1971 | Ellis, Jr. . |
| 3,702,456 | 11/1972 | Patton . |
| 3,798,587 | 3/1974 | Ellis et al. . |
| 3,820,058 | 6/1974 | Friend . |
| 3,877,771 | 4/1975 | Jensen et al. . |
| 3,899,237 | 8/1975 | Briggs, Jr. . |
| 4,013,332 | 3/1977 | Dauser, Jr. . |
| 4,066,317 | 1/1978 | Bierenfeld et al. . |
| 4,118,095 | 10/1978 | Berglund et al. . |
| 4,171,857 | 10/1979 | Forberg et al. . |
| 4,436,360 | 3/1984 | Knickerbocker . |
| 4,468,079 | 8/1994 | Knickerbocker . |
| 4,533,198 | 8/1985 | Anhalt ..................................... 439/404 |
| 5,074,801 | 12/1991 | Siemon . |

FOREIGN PATENT DOCUMENTS

| | | |
|---|---|---|
| 0000434 | 5/1983 | European Pat. Off. . |
| 0445376 | 11/1990 | European Pat. Off. . |
| 0487893 | 10/1991 | European Pat. Off. . |
| 1765271 | 4/1968 | Germany . |
| 2421056 | 4/1974 | Germany . |
| 2610461 | 3/1976 | Germany . |
| 2725551 | 6/1977 | Germany . |
| 1362416 | 9/1971 | United Kingdom . |
| 1423298 | 1/1973 | United Kingdom . |
| 1462920 | 7/1974 | United Kingdom . |
| 1434003 | 1/1975 | United Kingdom . |
| 1487124 | 9/1975 | United Kingdom . |
| 1526704 | 3/1977 | United Kingdom . |
| 1596347 | 5/1978 | United Kingdom . |
| 2084410 | 11/1978 | United Kingdom . |
| 2013423 | 1/1979 | United Kingdom . |
| 2037096 | 9/1979 | United Kingdom . |
| 2112217 | 12/1981 | United Kingdom . |
| 2115990 | 2/1983 | United Kingdom . |
| 2242080 | 3/1990 | United Kingdom . |

OTHER PUBLICATIONS

International Search Report.

*Primary Examiner*—David L. Pirlot
*Attorney, Agent, or Firm*—Hamilton, Brook, Smith & Reynolds

[57] ABSTRACT

An insulation displacement contact comprises first and second contact portions each of which comprises a cantilevered split beam. The upper split beam, which receives insulated wires, comprises a pair of tynes which are folded about the axis of a slot separating the tynes such that the internal angle between the tynes is approximately 90°. The width of the times is larger than that of prior art devices resulting in increased stiffness and the length of the tynes is sufficiently long to receive two wires therebetween.

The contacts are mounted in a housing which includes a plurality of teeth provided with means for retaining lugs on the end of the tynes to ensure bowed opening of the tynes on insertion of a wire. The contacts are arranged along the central axis of the housing such that the folded tynes of alternate contacts extend on opposite sides of the central axis.

20 Claims, 3 Drawing Sheets

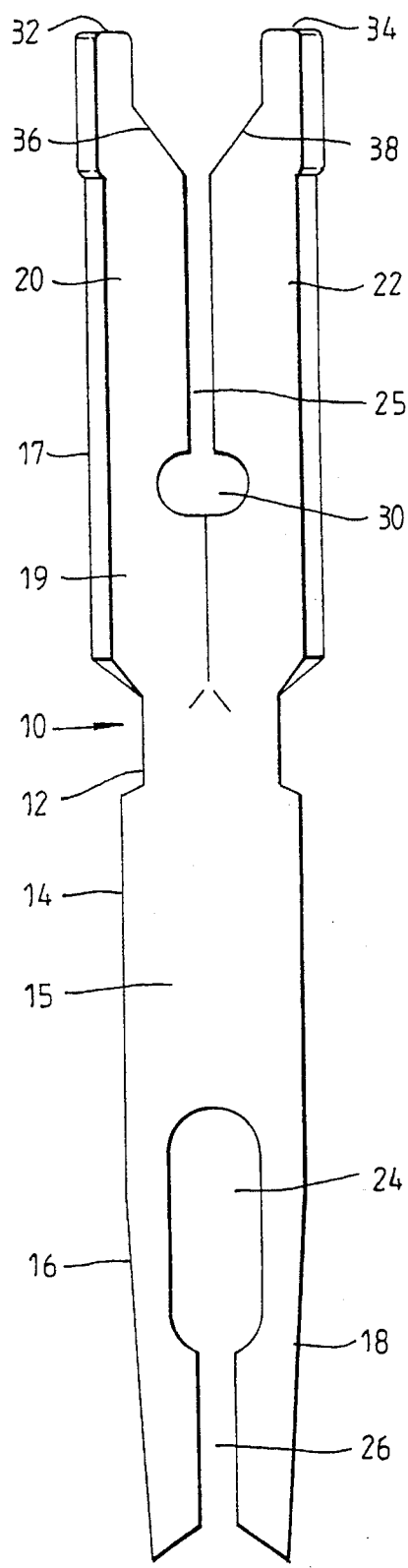
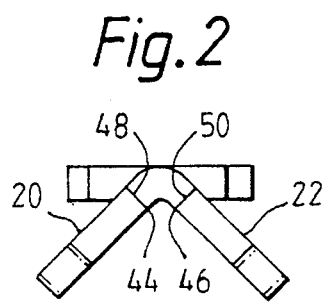
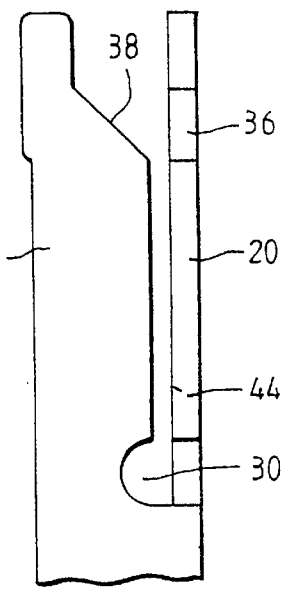
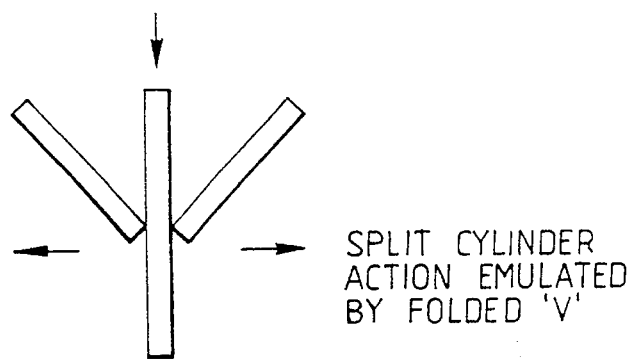
SPLIT CYLINDER ACTION EMULATED BY FOLDED 'V'
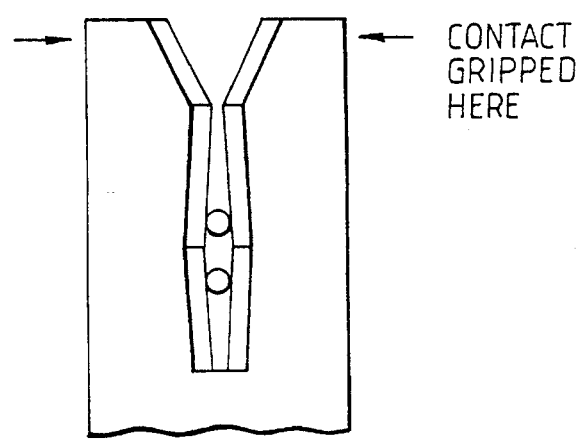
CONTACT GRIPPED HERE

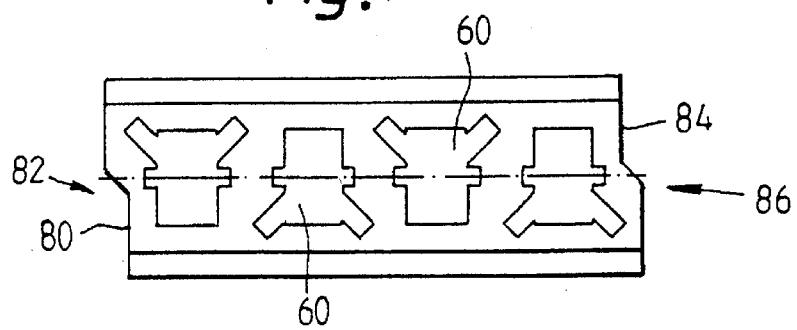
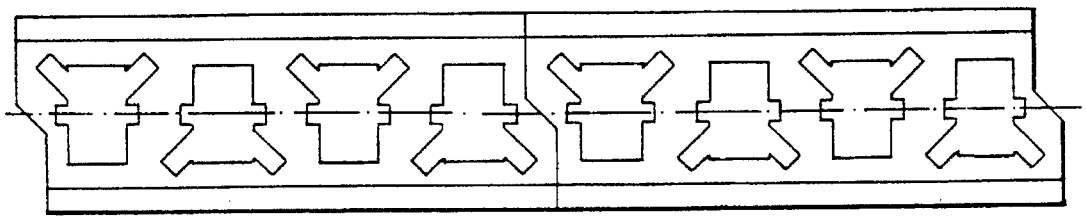
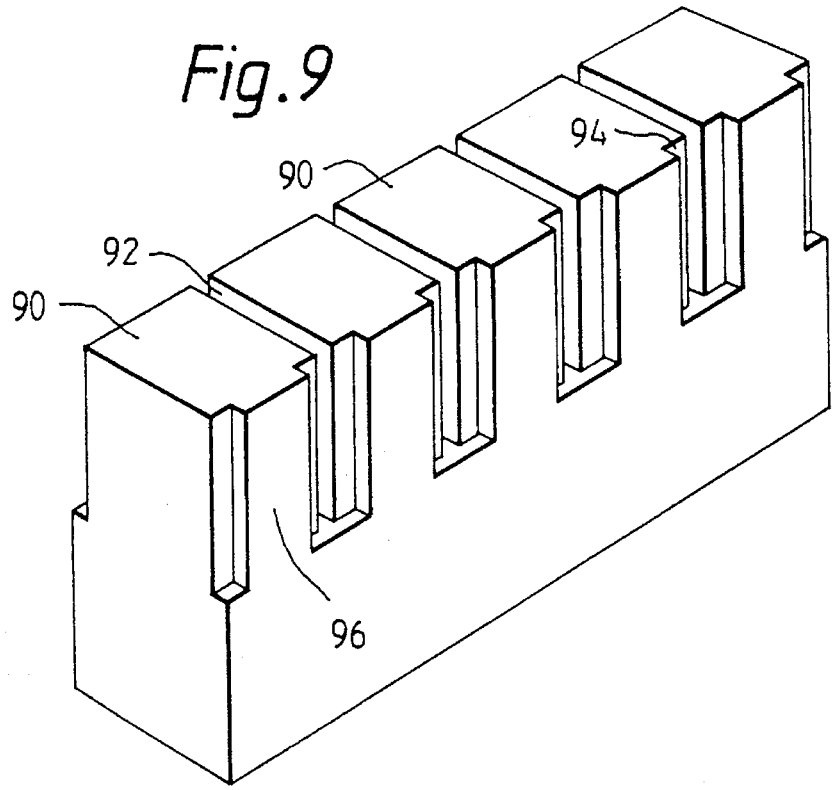

ELECTRICAL CONNECTORS

BACKGROUND OF THE INVENTION

This invention relates to electrical connectors and in particular to insulation displacement contacts which are commonly mounted in connecting blocks for connecting insulated wires either to contacts on a wiring block or to a second set of wires. The Invention also relates to connecting blocks for housing insulation displacement contacts.

Insulation displacement contacts are of particular applicability to the voice and data communications industry. There have been many proposals for insulation displacement contacts (IDC) in the past. However, all prior proposals suffer from one or more of number of disadvantages as will be described.

The basic function of a connector block is to house a number of insulation displacement contacts, normally 4 or 8. The individual contacts provide at one end a pair of contacts for attachment either to a wiring block or to individual wires and at the other end a pair of contacts for receiving an insulated wire. The contacts are disposed in a manner which ensures that the insulation around the wire is stripped away or displaced as the wire is fed between the contacts. Commonly, this has been achieved by a cantilevered split beam where the two beam halves are displaced by a distance less than the width of the insulation of the wire with which the connector is to be used. The open ends of the beams are usually shaped so that the wire can be guided between the beam halves or tynes and a slot or opening is provided to retain the wire, with its insulation displaced, in contact with the connector and to give the tynes a degree of flexibility.

U.S. Pat. No. 4,964,812 (Siemon) discloses an IDC which comprises two opposed cantilevered beams each of which comprises a pair of tynes and each of which extends from a central portion. Each tyne pair is separated by an elongate opening along a part of its length and is formed from an original cantilevered beam by shearing along a shear axis which forms the cutting surface for cutting the insulation on a wire. The shear axis is conveniently the longitudinal axis of the cantilevered beam. This shearing produces a closed gap between the tynes of a beam. However, a secondary closing action is necessary to achieve a satisfactorily small gap between the tynes. This is achieved by a coining operation performed on the outside edges at the base of the tynes and decreased coin surfaces pre-load the beam elements whilst maintaining clean contact surfaces and raising the contact force to a level where it is sufficient to penetrate the insulation on small wires.

The need for a secondary operation to close the slot to the required dimension is undesirable and arises from an attempt to overcome problems with beam stiffness by increasing contact thickness.

The performance of a split beam contact is determined by the stiffness of the beam, which is itself proportional to the cube of the contact width in the direction of flexing. The requirement for contact stiffness is in direct conflict with the requirement that the IDCs have the smallest possible pitch so as to minimise installation space and connector block width.

The solution proposed in U.S. Pat. No. 4,964,812 requires the secondary closing operation because the beam stiffness problem has been overcome by increasing contact thickness rather than width. The result is an IDC which is difficult to manufacture.

A similar approach has been taken by A T & T in their 110 series connectors, for example the 110C-4. The displacement contacts for the connectors are described in a number of U.S. patents, for example U.S. Pat. No. 3,611,264 (Ellis), U.S. Pat. No. 3,798,587 (Ellis) and U.S. Pat. No. 4,118,095 (Berglund).

The contacts described in all these documents suffer from the same problems as the Siemon patent due to the attempt to solve beam stiffness problems by increasing contact thickness.

It has been proposed to overcome the requirements of a stiff beam and a narrow contact by producing a wide beam and rotating it in the connecting block by an angle of 45° to the central block axis. However, this approach still requires that a narrow slot is produced between the tynes, requiring a secondary closing operation and necessitating a wider moulding than the A T & T or Siemon solutions.

U.S. Pat. No. 4,295,703 (Northern Telecom) proposes a solution in which the gap between tynes is wide and the contacts are arranged in staggered rows. Although this alleviates the problems of closed gap connectors such as the A T & T and Siemon connectors it has the disadvantage that it requires a complex wire insertion tool to feed wires between the tynes and also a connecting block which must be made wider than is desirable to accommodate two rows of contacts.

A problem encountered with connector blocks which house insulation displacement contacts is end wall thickness. As the blocks usually house four or eight contacts it is usual to arrange a number of blocks side by side along a wiring block. The wiring block has a plurality of IDC receptors which are spaced apart evenly. End walls of adjacent connector blocks which abut one another tend to have a combined thickness which is too great for the spacing between the receptors on the wiring block.

Merely reducing the thickness of the end walls can lead to a structure which is too weak. U.S. Pat. No. 4,964,812 mentioned previously overcomes the problem by using free floating insulation displacement contacts and by displacing the end contacts away from the end wall by about 0.005 inches (0.0127 cm). This enables the thickness of the end wall to be increased by about 30% and reduces end wall breakages. However, it does have the problem that it relies on very high manufacturing tolerances and on the use of free floating contacts.

GB-A-2112217 (Broomadit Limited) discloses a system in which the tynes are folded around a central axis. The tynes are held firmly in place in the housing.

The present invention aims to overcome or alleviate the above mentioned problems.

SUMMARY OF THE INVENTION

Broadly, the invention provides an insulation displacement connector in which at least one tyne of a split beam are folded about the split line and which deforms in a bowed or barrel shaped manner on insertion of a wire.

Preferably, the beam portions are folded such that they have an internal angle of about 90°.

This solution to the problems with the prior art has a number of advantages. Firstly, folding of the tyne portions enables a wider beam to be used without actually requiring a wider connector. This enables the beam stiffness problem to be overcome as the stiffness is increased without varying the thickness of the tynes, thus overcoming the problems of the Siemon and AT & T patents outlined above.

Moreover, the increase in stiffness enables longer tynes to be used. The effect of this is that two wires can be accommodated in a single IDC. This in turn has the advantage that fewer connectors are required in any given instance. This has considerable cost savings.

The free ends of the tynes are provided with lugs for retention in the connection block. This has the advantage that when a wire is introduced into the mouth of the contact, the displacement of the V-shaped contact will not be V-shaped but barrel shaped as the tynes are prevented from moving outwards at their free ends. Thus, the displacement force will be the same on both of two wires introduced into the connector device. If the free ends were not retained there would be a lower retaining force on the second two wires inserted between the tynes which might result in the insulation not being adequately displaced.

The ability to flex in a bowed or barrel shape is not present in GB-A-2112217 referred to earlier. The tynes are not provided with lugs at their free ends and do behave like conventional V shaped beams. For a bowed displacement the tynes must be restrained firmly at their free ends when a wire is inserted. Thus, the contacts cannot terminate more than one wire, and so are not suitable for 'daisy chain' connections. The contacts of GB-A-2112217 function in essentially the same manner as the AT & T contacts referred to previously.

A contact embodying the present invention functions in the same manner as a split cylinder contact but overcomes the disadvantage of that type of contact which requires that wires are cut off for connection which is undesirable.

The invention also resides in a connector block which is provided with a plurality of teeth each of which have retaining means for preventing lateral outward movement of the tynes of the cantilevered split beam.

Preferably, the connector is provided with means for receiving a plurality of contacts such that the folded times of alternate contacts extend on opposite sides of the central longitudinal axis of the connector. This arrangement has the advantage that the contacts can be pitched close together, thus so minimising the size of the connector.

Preferably the end walls of the connector block are reduced in thickness on the side of the central longitudinal axis opposite to that on which the tynes of the insulation displacement contact adjacent the respective end wall extend.

Preferably the reduced thickness end walls have a stepped configuration whereby adjacent connector blocks may be arranged along a wiring block without having to weaken the end walls.

The combination of reduced end wall portions and contacts disposed on alternate sides of the central axis eliminates the need for irregularly spaced floating contacts whilst retaining the advantages of having sufficiently thick end walls. As the preferred arrangement of the contacts in the block retains the free ends to provide a barrel shaped opening, the solution in U.S. Pat. No. 4,964,812 is not suitable.

Thus, the preferred arrangement maintains a high end wall strength without changing contact pitch and whilst allowing the connector to be continuously end stackable.

A relatively wide slot is one which is insufficiently small to remove the insulation from a small gauge wire which, when folded around the slot axis is sufficiently small at one edge to remove the insulation.

The folding of the tynes about the slot axis has the further advantage that a sharp knife-edge corner of the inner side of the tyne cuts into the insulation on the wire. This means that there is little resistance to cutting from the wire so facilitating insertion of a wire into the connector. In the prior art arrangements it is the flat inner face of the times which cut into the insulation which may lead to a considerable resistance to insertion.

BRIEF DESCRIPTION OF THE DRAWINGS

An embodiment of the invention will now be described, by way of example, and with reference to the accompanying drawings in which:

FIG. 1 is a front elevation of an insulation displacement contact embodying the invention:

FIG. 2 is a top view of the contact of FIG. 1;

FIG. 3 is a part perspective view of the upper part of the contact of FIG. 1:

FIG. 3a) and 3b) are, respectively, plan and front views of a schematic contact embodying the invention and illustrating the mode of opening.

FIG. 7 is a view similar to FIG. 6 of an alternate housing;

FIG. 8 shows how successive housings may be end-stacked; and FIG. 9 is a perspective view of a housing adapted for use with two or more different wire insertion tools.

DETAILED DESCRIPTION OF THE INVENTION

Figure 4:
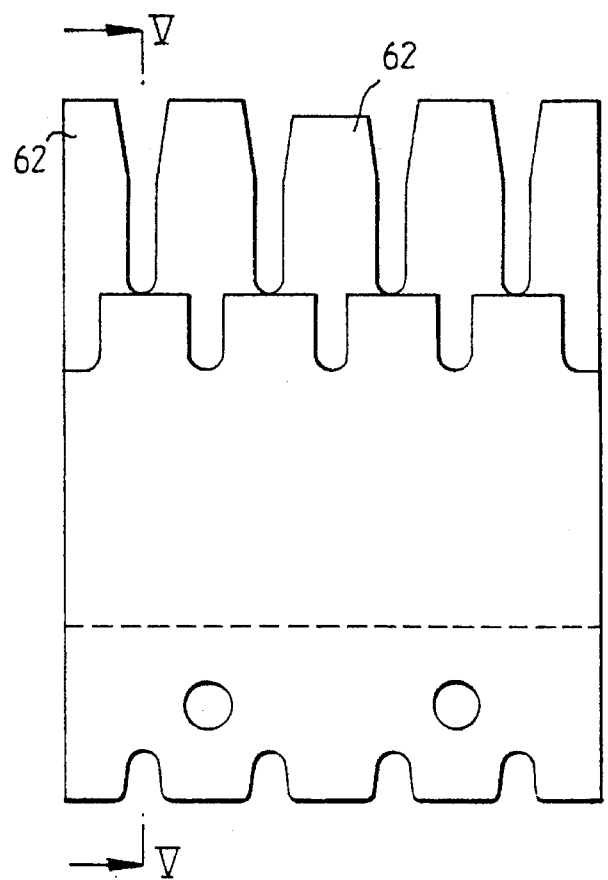
FIG. 4 is a side view of a housing for the contact of FIGS. 1 to 3.

The insulation displacement contact (IDC) 10 of FIGS. 1 to 3 comprises a central waisted portion 12, a lower contact 14 comprising a first cantilevered beam 15 having a pair of tynes 16 and 18 and an upper portion 17 comprising a second cantilevered split beam 19 having tynes 20 and 22.

The lower contact is intended to contact the IDC to a terminal of a wiring block (not shown) to establish electrical contact between the wiring block and one or more insulated electrical wires inserted into the upper portion in a manner to be described. An aperture 24 is formed between the tynes 16 and 18 at the base of the beam 15. The aperture extends over approximately half the length of the tynes. Over the other half the tynes are separated by a slot 26. The outer sides of the tynes are tapered so that the width of the beam reduces towards its free end to facilitate insertion into the wiring block terminal.

The upper cantilevered split-beam 19 comprises the two tynes 20, 22 which are folded about the axis of slot 28. In the example shown in FIGS. 1 to 3 the internal folded angle is approximately 90°.

Although this angle is the most preferred it is by no means the only angle through which the tynes may be folded. A range between 30° and 120° is preferable. However, folding outside this range still benefits from the advantages of the invention.

In the example shown in FIG. 3 each tyne is folded through 45°. However, one tyne could remain unfolded where the other would be bent through twice the angle, that is 90°. Again, this angle is not to be considered as a limiting example.

As shown in FIG. 1, a slot 25 extends along the centre portions of the tynes, 20, 22 and terminates at the base of the beam in an aperture 30. The aperture is generally circular. At the free ends of the tynes, 20, 22 lugs 32, 34 are formed. The width of the tynes at the lugs is slightly greater and the inner edges of the tynes are cut away to define the lugs and also to define guide surfaces 36, 38 which guide a wire as it is inserted into the narrow slot 28.

The contact 10 is first formed as a flat strip into which the apertures 24 and 30 and slots 26 and 28 are formed. Then, the upper tynes are folded around the axis 40 of slot 25 which is the centre axis of the upper beam. As mentioned previously, it is preferred that the folding angle is 45° for each tyne.

Slot 28 is relatively wide before folding. A relatively wide slot is one which is not sufficiently narrow to ensure removal of insulation material from the smallest wire which must fit into the connector. However, once the tynes have been folded through the required angle, the width of the inner surface of the slot is decreased such that it can cut the insulation of the smallest wires which are intended to be received into the contact. Moreover, the cutting is performed by cutting surfaces 46 and 44 (FIGS. 2 and 3) which present a sharp knife edge to the insulation. In the comparable prior art described above, cutting is performed by inner faces 48 and 50.

The folding of the tynes around axis 40 enables tynes of greater width to be used than in the prior art without an increase in the cross-sectional width of the contact. The increase in width leads to an increase in stiffness which in turn enables longer tynes to be used such that two wires can be inserted between the tynes.

FIGS. 3a) and 3b) show schematically how the contact functions. The contact shown in these figures is not intended to show all the features of FIGS. 1 to 3 but is illustrative of function only. Thus, the lugs 32, 34 for example are not shown.

Because respective the tynes are secured at their open ends and the contact is gripped, insertion of a wire causes the contact to bow out and deform elastically in a barrel shape. In other words, although the contact is V-shaped split beam, it behaves as a split cylinder. As can be seen from FIG. 3b) one advantage of this is that two wires can be inserted into the same contact allowing daisy chaining. This is not possible in normal V-shaped contacts where the ends are forced apart by the first wire.

Referring back to FIGS. 1 to 3, it will be seen that the lugs extend beyond the sides of tynes in a direction perpendicular to the axis of the slot 28. This enables the tynes to bow out when the contact is held rigidly in a housing, as there is a gap between the housing wall and the sides of the tynes beneath the lugs 32, 34.

Figure 5:
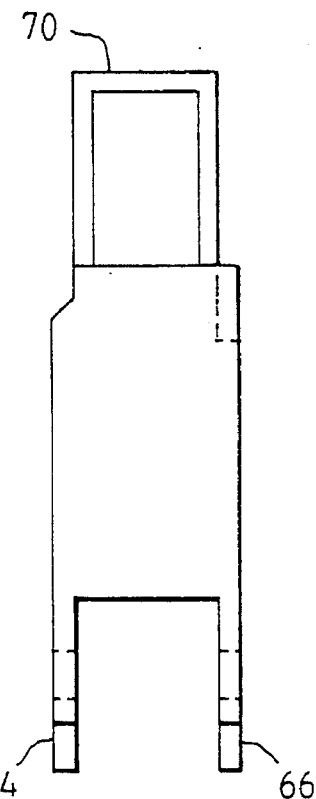
FIG. 5 is a view on the line V—V in FIG. 4.
Figure 6:
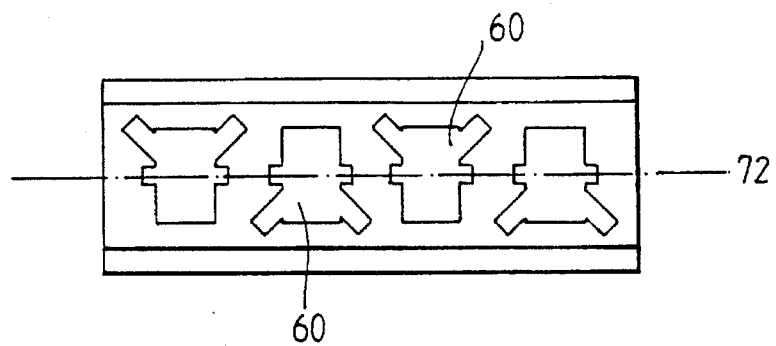
FIG. 6 is a view from below of the housing of FIG. 4.

Referring now to FIGS. 4 to 6, the connecting block is a single piece moulding with apertures 60 for receiving the insulation displacement contact. These apertures extend through the connecting block such that the open end of the upper cantilevered beam 19 is accessible in between teeth 62 at the top of the connector block and the lower cantilevered beam 15 is partially shielded by flanges 64, 66 which depend from the body of the connecting block. In position, the open ends of the lower centilevered beam 15 extend proud of the bottom of the flanges. It should be understood that the insulation displacement contacts are not shown in FIGS. 4 to 6.

The connector of FIGS. 4 to 6 is suitable for receiving four insulation displacement contacts. However, the number is immaterial and the block may be made to receive as many IDC's as is required.

The design of connecting blocks is well documented in the art, for example in U.S. Pat. No. 4,964,812 and U.S. Pat. No. 3,798,587 referred to previously and both herein incorporated in their entirety by reference. Further description will only be given in respect of novel features.

To enable the barrel shaped opening of the IDC 10, the lugs at the free end of the upper cantilevered beam 19 must be prevented from moving outwards when a wire is inserted into the contact. This is achieved by means of a retaining wall 70 on the internal face of each connector block tooth 62. A wall of each tooth facing one of the openings into which wires are inserted into a respective IDC carries a retaining wall 70. An example of the wall is shown in FIG. 5. The wall comprises a protruding portion which extends around the periphery of the tooth such that it surrounds the lugs of the respective IDC which is shown in partial outline in FIG. 5. Thus, when a wire is inserted into the IDC, the tynes are restrained from deforming in their natural V-shape and forced to deform in a barrel shape.

FIG. 6 shows how the IDC's are arranged in the connecting block for maximum density and minimum block dimensions. The IDC's are arranged along the central axis 72 but with the folded tynes alternately extending on opposite sides of the centre axis 72. The insulation displacement contact described and the connector block within which it is located have a number of advantages over the prior art as discussed herein. In particular, the IDC is easy to manufacture and can be mounted in a very compact connecting block. Moreover, the use of a folding tyne arrangement enables a single IDC to be lengthened to receive two wires which further increases compactness. The combination of the lugs on the tynes and the retaining wall on the teeth of the connector housing obviates the need for a secondary contact retention device such as is required in the arrangements of U.S. Pat. No. 4,964,812 and U.S. Pat. No. 3,798,587.

FIG. 7 shows an alternate embodiment of the connecting block in which the width of the end wall of the block is reduced on the side of the central axis 72 opposite to the side on which the folded tynes of the adjacent IDC extend. Thus, in FIG. 7 wall portion 80 of end wall 82 is of reduced thickness and wall portion 84 of end wall 86 is of reduced thickness. The reduced thickness portions are on opposite sides of the central axis 72 and form a stepped end wall. Adjacent end blocks may be arranged side by side as shown in FIG. 8 with the overall thickness of the abutting end walls sufficiently small for the blocks to be received side by side on a wiring block.

The arrangement described with respect to FIGS. 7 and 8 overcomes the problems with inadequate end wall strength encountered in the prior art by providing strength on the side of the central axis to which the end IDC is orientated. This solution requires that blocks have an even number of contacts.

The arrangement also obviates the need to space the contacts irregularly as is outlined in U.S. Pat. No. 4,964,812 and provides a simple, easy to manufacture housing.

In the embodiment of FIG. 9, the teeth 90 have been adapted to allow wires to be inserted by any commercially available wiring tool.

Wiring tools are well known and insert wires in the contact forks and then cut off the excess length. In the United Kingdom, the most commonly available wire inserters are manufactured and sold by British Telecom Plc and AT & T Corp. Neither tool will insert wires in connectors of the other manufacturer, as a consequence of which an installer must carry two wire insertion tools.

The embodiment illustrated is suitable for both tools. The forks of the insulation displacement contacts are located in slots 92 between the faces of the teeth 90. The outside walls of the teeth are provided with a step such that each tooth has a wide castellation portion 94 and a narrow castellation 96.

The wide castellation is suitable for locating the British Telecom tool whereas the narrow castellation is suitable for the AT & T tool.

In the embodiment illustrated, the steps are shown on one face of the connector. An alternative embodiment provides steps on both faces. The steps could be on alternate sides of the connector such that the step for one tooth is on the opposite side of the connector to the steps on the immediately adjacent teeth.

The embodiment described has the advantage of flexibility as the vast majority of wiring tools may be used to insert wires into it. This reduces the equipment needed by the installer and may reduce installation time.

The embodiment of FIG. 9, and its alternative may be used, for example, with any of the embodiments described previously. Although not shown in FIG. 9, the contacts are preferably those shown in FIGS. 1 to 3 and arranged as shown in FIG. 5.

We claim:

1. An insulation displacement contact comprising a first contact portion, and a second contact portion for receiving insulated wire and establishing electrical contact therewith through the insulated coating of the wire, the second contact portion comprising a cantilevered beam split into first and second tynes by a slot extending along an axis of the beam, at least one tyne being folded about the slot axis at an angle to the plane of the first contact portion, and the tynes each having a retaining means for limited opening of the open end of the cantilevered beam on insertion of a wire between the tynes, whereby to cause the tynes to form a bowed opening on wire insertion and a housing for retaining a plurality of said insulation displacement contacts, comprising a plurality of teeth for retaining and shielding contacts received in apertures in the housing, wherein the teeth each have a stepped side defining relatively wide and narrow castellations for receiving wire insertion tools.

2. An insulation displacement contact according to claim 1, wherein the internal angle between the first and second tynes is between 60° and 120°.

3. An insulation displacement contact according to claim 1, wherein the internal angle between the tynes is substantially 90°.

4. An insulation displacement contact according to claim 1, wherein each tyne is folded around the slot axis by a substantially equal amount.

5. An insulation displacement contact according to claim 1 wherein each tyne is folded about the slot axis by approximately 45° with respect to the plane of the first contact portion.

6. An insulation displacement contact according to claim 1, wherein the tynes are sufficiently long to receive more than one insulated wire therebetween.

7. A housing for retaining a plurality of insulation displacement contacts as defined in claim 1, comprising means for receiving the insulation displacement contacts shaped such that the insulation displacement contacts are disposed along a central axis of the housing and the folded tynes of alternate contacts are disposed on opposite sides of the said central axis.

8. A housing according to claim 1, wherein the thickness of the end walls of the housing is reduced on the side of the central axis opposite the side on which the tynes of the contact adjacent the respective end wall extend.

9. A housing according to claim 1, wherein the end walls have a stepped profile whereby adjacent connectors are end stackable.

10. A housing according to claim 1, wherein the housing comprises a plurality of teeth arranged on each side of the means for receiving the insulation displacement contacts whereby to shield and retain the contacts, each tooth having on its faces adjacent a receiving means, an abutment means for abuting the retaining means of the tynes to limit opening of the cantilever beam.

11. A housing according to claim 1, wherein the abutment means comprises a peripheral wall around the tooth.

12. An insulation displacement connector according to claim 1, wherein the retaining means comprises a lug at the free end of each tyne.

13. An insulation displacement connector according to claim 12, wherein the lugs extend beyond their respective tynes in a direction perpendicular to the beam axis.

14. A housing according to claim 1, wherein the teeth of the housing have a stepped side defining relatively wide and narrow castellations for receiving wire insertion tools.

15. A housing according to claim 14, wherein the relatively wide castellations are provided on a first side of the housing and the relatively narrow castellations on the opposite side of the housing.

16. An insulation displacement connector comprising a plurality of insulation displacement contacts, and a housing, the contacts being received in shaped apertures in the housing and comprising first and second contact portions, the second contact portions being arranged to receive insulated wires and comprising a cantilevered beam split into first and second tynes by a slot extending along an axis of the beam, at least one tyne being folded about the slot axis, the shaped apertures in the housing being arranged along a central axis of the housing to receive the contacts with the folded at least one tyne of alternate contacts extending on opposite sides of the central axis.

17. A connector according to claim 16, wherein the housing further comprises a plurality of teeth disposed on either side of the tynes and each having a retaining wall for receiving lugs on the free ends of the tynes to limit displacement of the tynes on insertion of a wire therebetween.

18. An insulation displacement connector comprising a housing, and a plurality of insulation displacement contacts, each received in a respective aperture in the housing, the housing having a plurality of teeth on each side of the apertures to shield the contacts, the teeth each having a stepped outer face, adjacent teeth defining relatively wide and narrow castellations for receiving wire inserter tools, the outer face of each tooth having a recess extending along the length of the tooth at each side of the face, the recesses of each tooth defining the relatively narrow castellations therebetween.

19. An insulation displacement connector according to claim 18, wherein the relatively wide castellations are provided on a first side of the housing and the relatively narrow castellations on an opposite side of the housing.

20. A housing for retaining a plurality of insulation displacement contacts, comprising means for receiving the insulation displacements contacts at a substantially constant pitch along an axis, first and second end walls having a stepped profile, the thickness of each end wall varying along the wall to define a relatively thin portion on one side of the axis and a relatively thick portion on the other side of the axis and the profile of the first end wall being the inverse of the profile of the second end wall, whereby two or more housings are stackable end to end with a constant insulation displacement contact pitch.

\* \* \* \* \*